(12) United States Patent
Landis et al.

(10) Patent No.: US 10,553,435 B2
(45) Date of Patent: Feb. 4, 2020

(54) METHOD FOR OBTAINING PATTERNS IN A LAYER

(71) Applicant: COMMISSARIAT A L'ENERGIE ATOMIQUE ET AUX ENERGIES ALTERNATIVES, Paris (FR)

(72) Inventors: Stefan Landis, Tullins (FR); Nicolas Posseme, Sassenage (FR); Lamia Nouri, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 310 days.

(21) Appl. No.: 15/538,526

(22) PCT Filed: Dec. 22, 2015

(86) PCT No.: PCT/EP2015/081062
§ 371 (c)(1),
(2) Date: Jun. 21, 2017

(87) PCT Pub. No.: WO2016/102609
PCT Pub. Date: Jun. 30, 2016

(65) Prior Publication Data
US 2017/0363954 A1 Dec. 21, 2017

(30) Foreign Application Priority Data
Dec. 22, 2014 (FR) .................................. 14 63145

(51) Int. Cl.
*H01L 21/266* (2006.01)
*H01L 21/3065* (2006.01)
(Continued)

(52) U.S. Cl.
CPC ............ *H01L 21/266* (2013.01); *B82Y 40/00* (2013.01); *C23C 14/042* (2013.01); *C23C 14/48* (2013.01);
(Continued)

(58) Field of Classification Search
CPC ............................ H01L 21/266; G03F 7/0002
See application file for complete search history.

(56) References Cited

U.S. PATENT DOCUMENTS

| 6,168,983 B1 | 1/2001 | Rumennik et al. |
| 2011/0097827 A1 | 4/2011 | Hatano et al. |

(Continued)

FOREIGN PATENT DOCUMENTS

| EP | 2 264 772 A2 | 12/2010 |
| FR | 2 977 071 A1 | 12/2012 |
| FR | 2 995 134 A1 | 3/2014 |

OTHER PUBLICATIONS

U.S. Appl. No. 15/538,564, filed Jun. 21, 2017, Stephan Landis et al.

(Continued)

*Primary Examiner* — Errol V Fernandes
(74) *Attorney, Agent, or Firm* — Oblon, McClelland, Maier & Neustadt, L.L.P.

(57) ABSTRACT

The invention relates in particular to a method for producing subsequent patterns in an underlying layer (120), the method comprising at least one step of producing prior patterns in a carbon imprintable layer (110) on top of the underlying layer (120), the production of the prior patterns involving nanoimprinting of the imprintable layer (110) and leave in place a continuous layer formed by the imprintable layer (110) and covering the underlying layer (120), characterized in that it comprises the following step: at least one step of modifying the underlying layer (120) via ion implantation (421) in the (Continued)

underlying layer (120), the implantation (421) being carried out through the imprintable layer (110) comprising the subsequent patterns, the parameters of the implantation (421) being chosen in such a way as to form, in the underlying layer (120), implanted zones (122) and non-implanted zones, the non-implanted zones defining the subsequent patterns and having a geometry that is dependent on the prior patterns.

22 Claims, 6 Drawing Sheets

(51) Int. Cl.
| | | |
|---|---|---|
| *G03F 7/00* | (2006.01) | |
| *B82Y 40/00* | (2011.01) | |
| *C23C 14/04* | (2006.01) | |
| *C23C 14/48* | (2006.01) | |
| *H01L 21/306* | (2006.01) | |
| *H01L 33/00* | (2010.01) | |
| *H01L 33/22* | (2010.01) | |
| *B82Y 10/00* | (2011.01) | |
| *B81C 1/00* | (2006.01) | |
| *H01L 31/0392* | (2006.01) | |
| *H01L 31/18* | (2006.01) | |

(52) U.S. Cl.
CPC ........ *G03F 7/0002* (2013.01); *H01L 21/3065* (2013.01); *H01L 21/30604* (2013.01); *B81C 1/0046* (2013.01); *B82Y 10/00* (2013.01); *H01L 31/0392* (2013.01); *H01L 31/1852* (2013.01); *H01L 33/007* (2013.01); *H01L 33/22* (2013.01)

(56) References Cited

U.S. PATENT DOCUMENTS

| | | | |
|---|---|---|---|
| 2011/0299194 A1* | 12/2011 | Aniya | G11B 5/66 360/135 |
| 2013/0284697 A1 | 10/2013 | England et al. | |
| 2014/0175051 A1 | 6/2014 | Feldbaum et al. | |
| 2015/0167155 A1 | 6/2015 | Feldbaum et al. | |
| 2015/0214099 A1 | 7/2015 | Grenouillet et al. | |

OTHER PUBLICATIONS

International Search Report and Written Opinion dated Feb. 22, 2016 in PCT/EP2015/081062 (with English translation).
Zhanna Smagina et al., "Nucleation and epitaxial growth of Ge nanoislands on Si surface prepatterned by ion irradiation", Physica Status Solidi. A: Application and Materials Science, vol. 210, No. 8, XP055219937, Jul. 2013, pp. 1522-1524.
Wei Zhou et al., "Fabrication of bridged-grain polycrystalline silicon thin film transistors by nanoimprint lithography", Thin Solid Films, vol. 534, XP055219967, May 2013, pp. 636-639.
Christoph Schmidt et al., "Artificial sub-[mu]m magnetic patterning by He+ ion bombardment through a mask fabricated by Ultraviolet NanoImprint Lithography (UV-NIL)", Nuclear Instruments & Methods in Physics Research, Section B: Beam Interactions with Materials and Atoms, vol. 322, XP028608291, Jan. 2014, pp. 59-62.
"Lithography and Nano-Lithography", Tuition House, www.iste.co.uk, Dec. 2010, 1 page.

* cited by examiner

Prior Art

Prior Art

METHOD FOR OBTAINING PATTERNS IN A LAYER

TECHNICAL FIELD OF THE INVENTION

The invention relates in general to the production of two-dimensional (2D) or three-dimensional (3D) structures that is to say the formation of structures that have a profile having at least two discrete levels of heights or that have an analog profile with a continuous variation in the tangents of the shape of the profile.

It has a particularly advantageous use in the field of nanoimprint lithography in which the reliefs are first reproduced in a temporary material in order for it to be possible to then faithfully transfer these reliefs, via the temporary material, into a substrate or a thin film.

The invention has an advantageous use in the production of structures in which the patterns formed in the underlying layer are buried or encapsulated.

PRIOR ART

The techniques of transferring reliefs via imprinting, also called nanoimprinting, are part of a generic technology that groups together a multitude of very different approaches that nevertheless all share a common point: the use of a stamp or mold that allows a 2D or 3D pattern to be transferred onto a surface or into the thickness of a material. All these approaches using the same technology thus have in common the fact that close contact between the original substrate of the information (the mold) and the substrate receiving this information (the substrate) is made during this operation.

In all cases, the nanoimprint technologies differ from conventional lithography methods (conventional photolithography using masks, electron lithography, X-ray lithography or ultra-violet or UV lithography) by the fundamental mechanism that creates the patterns. For all the above conventional techniques, the patterns are created via physico-chemical contrast. If it has a positive tonality, the resin exposed to light or to radiation can be selectively developed. The opposite occurs if the resin has a negative tonality. For nanoimprinting, the contrast is topographical: it is the movement of matter and the flow of the resin in the cavities of the mold that allow the production of specific patterns.

FIGS. 1a to 1c illustrate an imprinting operation during which a mold 100 penetrates a layer of resin 110 on top of a substrate 120 in order to form patterns in the resin 110. Once the patterns have been imprinted in the resin 110, they can be transferred into the substrate 120 via etching. Then, the patterns formed in the substrate 120 can be encapsulated by depositing an encapsulation layer that covers the totality of the patterns. The material of the encapsulation layer can be different from that of the patterns formed in the substrate 120. In this case, the encapsulation layer can be in contact with the patterns.

These patterns transferred into the substrate 120 are thus buried under an encapsulation layer.

The known solutions do not allow buried patterns having relatively complex shapes and dimensions that are precisely controlled to be obtained in a simple and reproducible manner.

FIG. 1b illustrates an ideal case in which the reliefs of the mold 100 come in contact with the substrate 120 while eliminating all presence of resin 110 between the top of the reliefs of the mold 110 and the substrate 120.

In practice, the implementation conditions are such that in the majority of cases, a pressure 105 of less than 100 bar is applied onto the mold 100 for a time of less than one hour and at a temperature that does not exceed 100° C. In these conditions, it is thus observed that with the materials used as a resin that are typically monomers, oligomers or polymers, the properties of the latter are such that they do not allow the reliefs of the mold 100 to reach the substrate 120 resin 110 interface during the pressing.

Consequently, as illustrated in FIG. 1c, a residual layer 131 of resin remains present between the surface of the substrate 120 and the reliefs of the mold 100. The thickness 130 of this residual layer 131 is dependent on the pressing conditions, but also on the geometry of the mold 100 and the initial volume of resin 110 available.

The problem of knowing whether a predictive approach to the pressing method could be proposed, in particular whether it is possible to predict the residual thickness 130 if the geometry of the mold 100 and the initial thickness 112 of the imprinted polymer are known, thus rapidly arose. This is illustrated by FIG. 2, in which the surface of a mold is defined using a function p(x, y) that describes its profile 210.

Given that the material to be imprinted can flow over distances identical to that of the sample, it is then possible to establish a simple criterion for knowing whether the mold can be completely filled or not. FIG. 2 shows an arbitrary profile of a 3D structure to be imprinted with the initial thickness 112 of material to be shaped, which is noted hereinafter as hi, with S being the surface of the substrate and of the mold and p(x, y) being the mathematical function describing the profile 210 of the mold. The calculation of the ratio (f) between the volume to be filled in the mold (Vm) and the volume of incompressible matter available (Vi) allows three configurations to be identified.

$$f = \frac{Vm}{Vi} = \frac{\iint_S p(x, y) dx dy}{h_i S} \begin{cases} < 1 \\ = 1 \\ > 1 \end{cases}$$

For a ratio f of less than 1, the total filling of the mold is possible since the matter is present in excess. In this case, the theoretical residual thickness ($h_r$) can be calculated and is therefore given by the following relation:

$$h_r = h_i - \frac{\iint_S p(x, y) dx dy}{S}$$

A ratio equal to 1 implies that the volume of matter available is equal to the volume to be filled, thus implying a theoretical residual thickness equal to zero. Finally, for a ratio of less than 1, the cavities of the mold cannot be completely filled.

It should be noted that this relation involves neither the pressing conditions (temperature, pressure, imprinting time) nor the properties of the material (viscosity, surface energy) and that consequently, it cannot be considered for describing the dynamics of the process. It can only reflect an ideal final state of the method. It also must be emphasized that this approach is highly simplified and is only slightly applicable as such due to the complexity of the fluid (resin) interaction with the structure (mold) during the pressing step. It can be verified, however, for the imprinting of patterns having a constant density, present on surfaces greater than several square millimeters (mm2). As soon as there is a modification of the density of the patterns to be imprinted, even over a short distance, this approach is no longer valid, and mold deformations during the pressing must be taken into consideration. This makes the predictive approach almost impossible, or very difficult, even with advanced digital tools.

The presence of the residual layer 131 of resin is therefore a problem specific to the technique of nanoimprinting. The presence of a residual layer and its thickness lead to two totally new problem sets for the implementation of the nanoimprinting:

after pressing, there is the problem of needing to eliminated this residual layer 131 of resin while preserving the shape and the dimensions of the imprinted patterns in order to obtain a mask of resin having the same characteristics as those that would be obtained with standard lithography techniques;

another problem is that of ensuring the uniformity of its thickness in order to be able to carry out the technological steps that follow without difficulty.

The first point is not a technological barrier when the material shaped then becomes a functional element of the component being manufactured. In the large majority of situations, however, the imprinted resin is only used as a mask in order to then transfer the topographical information to an underlying material using an etching method. In these cases, it is then necessary to have an etching method that is as anisotropic as possible (in the direction Z of the reference frame illustrated in FIG. 2), that is to say, that has an etching rate parallel to the plane of the substrate (plane X, Y) as low as possible or even, ideally, zero. In the opposite cases, any step of etching the residual thickness leads to modifications in the horizontal dimensions of the patterns imprinted and thus to a loss of information that is generally unacceptable during the corresponding lithography step as illustrated in FIGS. 3a to 3d described below. The development of etching methods that are as anisotropic as possible between two materials is a very common constraint in the field of microtechnology and nanotechnology. Their implementation can be very complicated for very small dimensions, smaller than 30 nanometers (nm), and for 3D profiles.

FIGS. 3a to 3d illustrate the problems set forth above that result from the need to need to remove the residual layer 131 of resin 110 after imprinting, via a method that must also be able to take into account the potential non-uniformity of this layer. It is only after removal of the residual layer 131 that the etching of the underlying substrate 120 can then be undertaken. FIGS. 3a to 3d show the impact of the horizontal 310 and vertical 320 etching rates on the preservation of the original dimensions.

It should be noted here that the uniformity of the residual thickness 130 is thus an important element for facilitating its removal and allowing the use of the resin mask as an etching mask. As previously mentioned, this value depends in general on the geometry of the mold, including geometric parameters such as the sizes of the various patterns, their densities, the ruptures in the symmetry of the structure of the patterns. The value for the residual thickness also depends, as seen in FIGS. 1 and 2, on the initial thickness 112 to be imprinted, as well as on the imprinting conditions: temperature, force applied, imprinting time. In FIG. 3a, the references 131' are used to illustrate zones in which the residual thickness is smaller than under other patterns 131".

One object of the present invention is therefore to propose a solution that at least partly limits the difficulties described above and that allows protected or encapsulated patterns, the dimensions of which are precisely controlled, to be obtained in a reliable and simple manner.

The other objects, features and advantages of the present invention will be clear after an examination of the following description and the accompanying drawings. It is understood that other advantages could be incorporated.

SUMMARY OF THE INVENTION

To achieve this goal, one aspect of the present invention relates to a method for producing subsequent patterns in an underlying layer, the method comprising at least one step of producing prior patterns in an imprintable layer on top of the underlying layer. The production of the prior patterns involves nanoimprinting of the imprintable layer and leaves in place, at the bottom of the patterns, a residual thickness of imprintable layer. The imprintable layer thus forms a continuous layer covering the underlying layer. The method comprises at least the following step:

at least one step of modifying the underlying layer via ion implantation in the underlying layer, the implantation being carried out through the imprintable layer comprising the prior patterns, the parameters of the implantation being chosen in such a way as to form, in the underlying layer, implanted zones and non-implanted zones, the non-implanted zones defining the subsequent patterns and having a geometry that is dependent on the prior patterns.

Advantageously, the implantation of ions is carried out in such a way that the underlying layer, typically a substrate, has a continuous non-modified zone located between the modified zones and a face of the underlying layer through which the ions penetrate during the implantation.

Thus, the invention allows buried patterns, the dimensions of which are particularly precisely controlled, to be obtained in the underlying layer. The zones modified during the implantation can be preserved or, on the contrary, removed.

Thus, an underlying layer is obtained having properties, for example optical modified because of the presence of this implantation of buried patterns.

Moreover, the buried patterns obtained are protected by the continuous zone that extends transversely from the upper face of the underlying layer and to the patterns.

This solution for encapsulating patterns is moreover faster to implement, less complex and less costly than a solution in which an encapsulation layer is deposited on zones that are already implanted or already etched.

Moreover, the invention allows possibly complex and very precise patterns to be obtained in the underlying layer while eliminating the disadvantages usually engendered by the residual layer.

With the known methods, the etching of this residual layer that is inevitably obtained at the end of the imprinting leads to undesired modifications that are difficult to predict in terms of the shape and/or the dimensions of the final patterns.

The invention, by being based on a step of modifying the underlying layer through the imprintable layer, allows the imprinted patterns or patterns that are dependent on the imprinted patters to be transferred into this underlying layer without having to remove the residual layer. The patterns obtained are not therefore deformed by a step of removing the residual layer.

In the context of the present invention, the adjective "underlying" in the expression "underlying layer" is relative only to the orientation and the direction of the implantation of the ions. The underlying layer is positioned downstream of the imprintable layer with respect to the direction of implantation of the ions. In the following drawings, when the orientation and the direction of implantation of the ions are vertical and downward, the underlying layer is positioned lower than the imprintable layer. If the implantation is directed vertically and upwards, the underlying layer, still positioned downstream of the imprintable layer with respect to the direction of implantation of the ions, would then be positioned higher than the imprintable layer in the drawings. Optionally, the invention can further comprise at least any one of the following features:

Advantageously, the step of producing prior patterns is carried out in such a way that for each of the patterns, the residual thickness of the imprintable layer is less than the minimum implantation depth of the ions implanted during said implantation, the minimum depth being taken in the implantation direction and starting from the surface of the imprintable layer. Typically, this minimum thickness corresponds to a residual thickness left in place by the nanoimprinting step.

The minimum thickness of the imprintable layer corresponds to the residual layer. By adjusting the thickness of the residual layer, it is thus ensured that the ions can be implanted without modifying a zone of the underlying layer that extends from the upper face of this layer. This non-modified zone is continuous in a plane parallel to the main plane in which the underlying layer extends.

Advantageously, the continuous non-modified zone located between the modified zones and a face of the underlying layer through which the ions penetrate during the implantation has a thickness greater than or equal to 10 nm, preferably greater than or equal to 20 nm, preferably greater than or equal to 30 nm and preferably greater than or equal to 40 nm.

According to one embodiment, the materials of the imprintable layer and of the underlying layer, as well as the parameters of the implantation, in particular the nature of the ions, are chosen in such ways that the materials of the imprintable layer and of the underlying layer have identical capacities of penetration of the ions.

Thus, under equal implantation conditions, in particular for the same energy of the ions, the ions penetrate a layer made of the material of the imprintable layer and a layer made of the material of the underlying layer in the same way.

Thus, when these layers are stacked, the implantation from the imprintable layer allows the patterns of this layer to be reproduced in the underlying layer. The implantation can be called "conformal" since the profile defined by the border between the implanted zones and the non-implanted zones reproduces the profile defined by the patterns imprinted in the imprintable layer.

This implantation of ions thus allows a transfer of patterns from the imprintable layer to the underlying layer to be carried out, the patterns transferred being formed by the modified material of the underlying layer.

According to one alternative embodiment, the materials of the imprintable layer and of the underlying layer, as well as the parameters of the implantation, are chosen in such ways that the materials of the imprintable layer and of the underlying layer have different capacities of penetration of the ions. Thus, the implantation from the imprintable layer allows patterns not identical to those of the imprintable layer to be generated in the underlying layer. Typically, the patterns of the underlying layer are scaled copies of those of the imprintable layer.

In general, the implantation conditions, the thickness of the residual layer and the thickness of the possible buffer layer are adjusted in such a way that in the modified zones, the ions are implanted continuously starting from the surface of the layer to be etched.

Alternatively, the minimum depth of implantation can be greater than the thickness of the residual layer plus the thickness of the possible buffer layer. Thus, in the modified zones, the ions are not implanted continuously starting from the surface of the layer to be etched.

Another object of the present invention relates to a microelectronic device comprising a plurality of patterns created using one or the other of the methods of the invention. Microelectronic device means any device made with means from microelectronics. In addition to the devices having a purely electronic purpose, these devices include, in particular, micromechanical or electromechanical devices (MEMS, NEMS . . . ) and optical or optoelectronic devices (MOEMS . . . ).

BRIEF DESCRIPTION OF THE DRAWINGS

The goals, objects, features and advantages of the invention will be better understood from the detailed description of an embodiment of the latter that is illustrated by the following accompanying drawings in which.

Figure 1A:
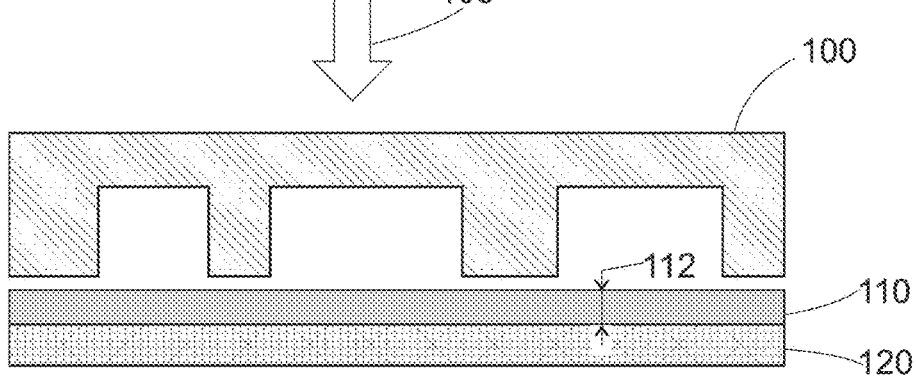
FIG. 1, consisting of FIGS. 1a to 1c, describes the steps of a nanoimprinting operation according to the prior art.

The drawings are given as examples and are not limiting to the invention. They are schematic representations of a principle intended to facilitate the understanding of the invention and are not necessarily on the scale of the practical applications. In particular, the relative thicknesses of the various layers, films reliefs and patterns are not representative of reality.

DETAILED DESCRIPTION OF THE INVENTION

Before undertaking a detailed review of embodiments of the invention, optional features are listed below that can optionally be used in combination or alternatively:

According to one embodiment, the parameters of the implantation comprise in particular a direction of implantation. The direction of implantation (direction Z in the reference frame illustrated in FIG. 4a) is perpendicular to the main plane in which the underlying layer extends. This is typically the plane X, Y of the reference frame illustrated in FIG. 4a.

According to one embodiment, the parameters of implantation are chosen in such a way that the subsequent patterns have a geometry identical to that of the prior patterns.

According to one embodiment, the materials of the imprintable layers and of the underlying layer, as well as the nature of the ions, are chosen in such a way that the penetration of the ions into one of the materials out of the material of the imprintable layer and the material of the underlying layer is greater than the penetration of the ions into the other of the materials out of the material of the imprintable layer and the material of the underlying layer.

According to one embodiment, the method comprises, after the modification step, at least one step of removing the modified zones (122) carried out selectively with respect to the non-modified zones, in such a way as to leave in place the non-modified zones.

Advantageously, the method according to any of the previous claims, wherein the removal step comprises a step of etching the modified zones (122) selectively with respect to the non-modified zones, the etching step being etching via a wet process or a dry process.

According to one embodiment, after the modification step, at least a portion and preferably all of the modified zones and of the non-modified zone are preserved.

According to one embodiment, said non-modified zone extends over the entire surface of the layer to be etched. Alternatively, it only extends over a portion of the upper face of the layer to be etched. According to one embodiment, it extends vertically in line with only some of the modified zones.

Advantageously, the implantation is carried out on the whole plate.

Preferably, the implantation of ions is carried out in such a way that the underlying layer has a continuous non-modified zone located between the modified zones and a face of the underlying layer through which the ions penetrate during the implantation. Thus, the underlying layer has a non-modified thickness separating the modified zones from the outside of the underlying layer. This thickness thus allows the modified zones to be encapsulated and protected. These modified zones thus form buried structures. They can have particular electric, optical, magnetic, thermal, mechanical properties in particular different from that of the non-modified zones, regardless of whether the modified zones are preserved or etched.

If the modified zones are preserved, at least one of their optical, electric, magnetic, thermal or mechanical properties is different from that of the patterns formed by a non-modified zone.

If the modified zones are removed, the patterns formed by the non-modified zones are thus surrounded, at least partially by a vacuum or a gas. The gas can be ambient air. It can also be a gas injected into the cavity formed by the removal of the modified zones. Indeed, gas can be injected via the input that was used for the etching of the modified zones. A plug is then formed in order to plug the input in order to preserve the gases in the structure. At least one of the optical, electric, magnetic, thermal or mechanical properties of the patterns formed by the non-modified zones is thus different than that of the gas that surrounds these patterns.

According to one embodiment, said etching of the modified zones forms at least one cavity. At least one gas is introduced into said cavity. According to one embodiment, a plug is then formed in order to plug an opening through which said at least one gas was introduced into the cavity. The introduction of this gas allows the optical, electric, mechanical parameters of the structure to be adjusted. Moreover, the presence of the continuous layer allows this gas to be confined reliably and in a simple manner inside the structure.

Preferably, the implantation is carried out using an implanter configured in such a way as to only implant ions starting from a non-zero depth of the underlying layer. Thus, the implanter does not implant the ions continuously starting from the surface of the underlying layer through which the ions are implanted.

According to one embodiment, the method comprises, between the step of producing the prior patterns and the implantation step, a step of depositing a protective layer covering the prior patterns. Advantageously, this layer protects the prior patterns during the implantation. The latter thus preserve, during the implantation, the shapes and dimensions conferred by the imprinting.

Preferably, the protective layer is a layer of carbon deposited via a plasma.

According to an alternative embodiment, the underlying layer is directly in contact with the imprintable layer.

Advantageously, the implantation parameter, in particular the energy imparted on the ions, the time and the implantation dose are chosen in such a way that the implanted zones can be etched selectively with respect to the non-implanted zones. Preferably, these implantation parameters allow the matter to go from a crystalline state to an amorphous state.

Preferably, the implantation of species relates to all the elements that can be implanted in the material to be etched, without causing a dislocation of its atomic structure such that it would lead to an atomization of the matter implanted, are capable of being suitable.

For example, the ions implanted are taken from hydrogen (H2), helium (He), argon (Ar) and nitrogen (N2). Just one or several of these species can be implanted.

According to one embodiment, the implantation is carried out anisotropically, in at least one implantation direction substantially perpendicular to the plane in which the layer to be etched or a substrate on which the layer to be etched is placed extends. In the drawings, the preferred direction of implantation is the direction Z.

In the context of the present invention, the methods known to a person skilled in the art and software (SRIM, TRIM, CTRIM . . . ) that allows the resulting implantation, and in particular the depth of implantation, to be simulated on the basis of the conditions of implantations can be used. Among the parameters of the implantation are the following: the nature of the species implanted, the material of the underlying layer, the material of the imprintable layer, optionally the material of the buffer layer, dose, energy, time of exposure of the implanted layer to the beam of ions.

According to one embodiment, the underlying layer is a layer or a substrate, the material of which is taken from: silicon, silicon germanium, germanium, quartz. According to one embodiment, the underlying layer is a thin film or an active layer formed out of one or more conductive materials.

The imprintable layer is formed out of one or more imprintable materials. It is typically formed out of an imprintable resin.

According to one embodiment, the underlying layer is directly in contact with the imprintable layer.

According to one embodiment, the underlying layer is a layer or a substrate, the material of which is SiOCH.

According to one embodiment, during the implantation, there is a buffer layer on top of the underlying layer made of SiOCH, located between the imprintable layer and the underlying layer. According to one embodiment, the method comprises a step of removing the imprintable layer, and during the removal step, the buffer layer is on top of the underlying layer made of SiOCH. Thus, the buffer layer protects the SiOCH during the step of removing the imprintable layer. Indeed, the SiOCH, especially when it is porous, can be damaged during this step. This embodiment thus allows a very good surface state to be preserved.

According to one embodiment, the buffer layer is made of $Si_xN_y$ or $Si_xO_y$, preferably of SiN or $SiO_2$. According to one embodiment, during the implantation, the buffer layer has a thickness greater than or equal to 10 nm and preferably greater than or equal to 20 nm.

According to one embodiment, the underlying layer forms the active layer of a photovoltaic cell.

According to one embodiment, the underlying layer is a substrate made of sapphire and forms, together with the subsequent patterns, a patterned sapphire substrate (PSS).

According to one embodiment, the invention relates to a method for manufacturing a light-emitting diode (LED) comprising a patterned sapphire substrate (PSS), wherein the patterned sapphire substrate (PSS) is obtained by the method of the previous paragraph.

According to one embodiment, the invention relates to a method for manufacturing a plurality of photovoltaic cells, comprising a substrate covered with patterns, wherein the patterns are obtained by the method according to the invention.

It is specified that in the context of the present invention, the terms "on", "is on top of", "covers" and "underlying" and the equivalents thereto do not necessarily mean "in contact with." Thus, for example, the deposition of a first layer on a second layer does not necessarily mean that the two layers are directly in contact with each other, but this means that the first layer at least partly covers the second layer while either being directly in contact with it or being separated from it by at least one other layer or at least one other element.

In the context of the present invention, the thickness of a layer is taken in a direction perpendicular to the main faces of the substrate on which the various layers rest. In the drawings, the thickness is taken in the direction Z.

Figure 1B:
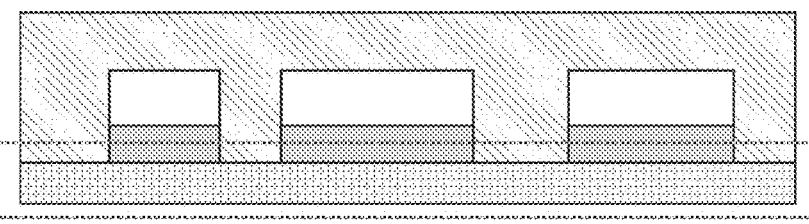
Figure 1C:
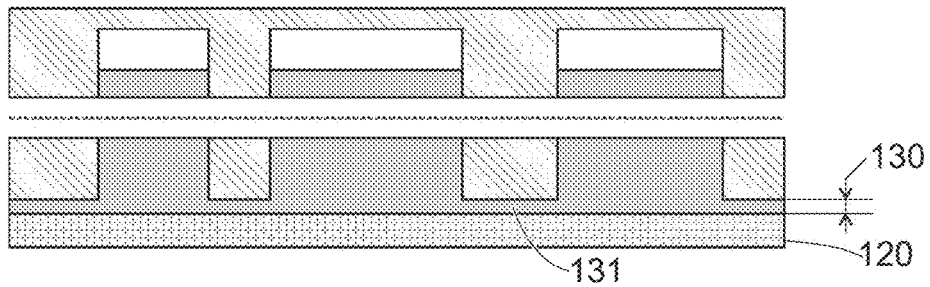
Figure 2:
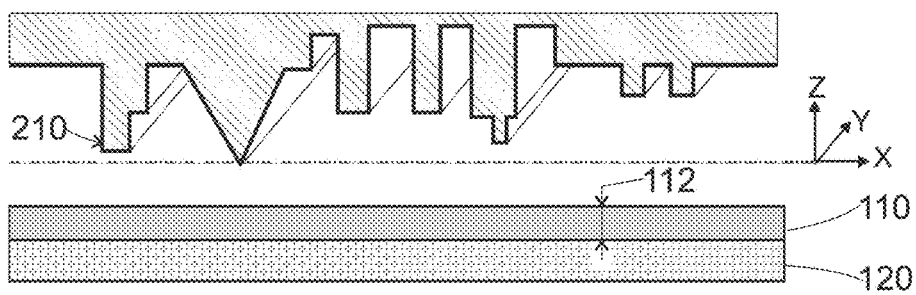
FIG. 2 shows the definition of a mold using a function that describes its profile.
Figure 3A:
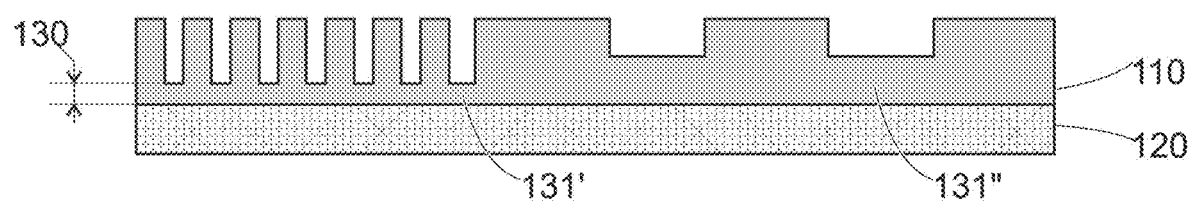
FIG. 3, consisting of FIGS. 3a to 3d, illustrates the problems posed by the removal of the residual layer of resin after an imprinting operation.
Figure 3B:
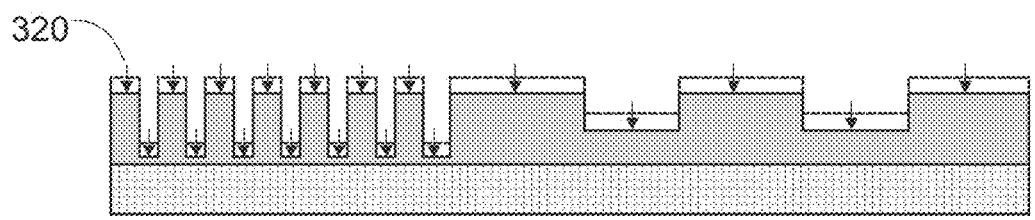
Figure 3C:
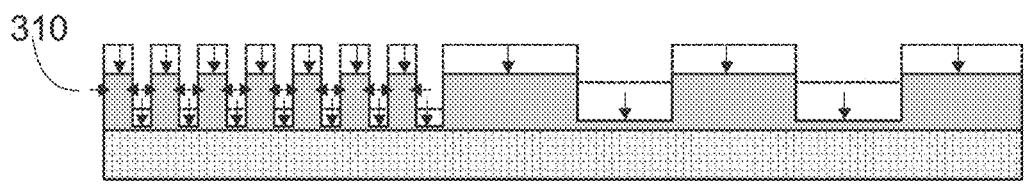
Figure 3D:
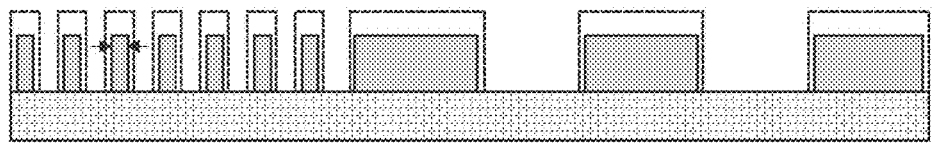

In the context of the present invention, a three-dimensional (3D) pattern means a pattern having, in a given layer, for example a resin or a substrate, an analog profile with a continuous variation of the tangents of the shape of the profile like in FIG. 11 or having at least two levels of depth below the upper face of the layer when the pattern is hollow or at least two levels of height above an upper face of the layer when the pattern is protruding. A pattern called 2D pattern designates the particular case of a pattern only having two levels of height or depth like in the example of FIG. 1.

An embodiment of the present invention will now be described.

In a first step 410, an operation of nanoimprinting is carried out in a conventional manner in an imprintable layer 110 using a mold. The mold has reliefs with possibly complex shapes. The imprintable layer 110 is typically formed in a layer of imprintable resin.

Preferably before the imprinting, the imprintable layer 110 has been deposited on an underlying layer 120 intended to be etched.

The underlying layer is typically a substrate 120 or a thin film. In the rest of the description, for reasons of conciseness and clarity, "substrate 120" designates this underlying layer below the imprintable layer 110 and in which the patterns of the resin will be transferred. This term is not in any way limiting to the nature and the function of this layer. The terms "substrate", "layer to be etched" and "underlying layer" are thus equivalent.

During the imprinting operation, there is no attempt, like it is done in the techniques of the prior art, to minimize the thickness 130 of the residual layer 131. On the contrary, it is ensured that the latter has a thickness that is as homogenous as possible over the entire surface in question.

In a second step 420, an implantation 421 of ions of gaseous elements is carried out with the goal of obtaining a structural modification of the material forming the layer 120 to be etched starting from its surface.

The ions used are taken, for example, from: hydrogen (H), argon (Ar), nitrogen (N) and helium (He).

The implantation is carried out through the imprintable layer 110 preformed by nanoimprinting. The implantation is thus carried out at various depths in the substrate 120, reproducing the patterns in relief of the imprintable layer 110 and thus forming a zone 112 of modified material.

Indeed, if the capacity of the ions to penetrate the material of the imprintable layer 110 and that of the substrate 120 is substantially identical, the depth of penetration of the ions, measured in the implantation direction and at each point of the face of the imprintable layer 110 through which the ions penetrate, is uniform. Thus, the depth of penetration reproduces the patterns of the imprintable layer 110. The implantation is thus conformal in the sense that the profile formed by the border between the implanted zones and the non-implanted zones reproduces the profile of the patterns imprinted in the imprintable layer.

Consequently, the zones in the substrate 120 under the areas in which the thickness of resin is the smallest are modified to a greater depth than the zones in which the thickness of imprintable resin is large.

According to another embodiment, the depths of penetration of the ions in the imprintable layer and in the substrate are intended to be different. The patterns reproduced in the substrate are not therefore conformal with respect to those of the imprintable resin. The patterns implanted in the underlying layer are then scaled copies of the initial shapes. Preferably, the depth of penetration for the substrate (underlying layer) will be smaller since usually, the density of the material of the substrate is greater than the density of the imprintable material, and thus the penetration of the ions is made more difficult.

The modification obtained by the implantation of ions involves, for example, making a material that is initially crystalline amorphous. The material made amorphous is typically crystalline silicon (Si) that is very widely used in the microelectronics industry. The implantation is adjusted in order for the zones of the layer or substrate 120 under the zones in which the thickness of resin is the greatest to not be modified.

In the following step 430, the imprintable layer 110 can then be removed. The method of removal is adapted to the type of resin used. It can be "wet" etching that is to say that it is carried out in a suitable liquid solution that dissolves the resin without attacking the underlying layers. "Dry" etching can also be used, using a plasma formed in a confined chamber. These techniques are well known and routinely used in the microelectronics industry.

The last step of the method of the invention involves removing the zones 122 made of material modified by the implantation of ions in the layer 120. This removal step is solely optional. This removal step is carried out selectively with respect to the non-modified zones of the substrate 120. The implantation and etching conditions must thus be adjusted in such a way that the etching be selective for the zones 122 modified by implantation with respect to the non-modified zones that are not, or only much less, removed by etching.

For example, the removal of these zones 122 is carried out via wet etching, typically using tetramethylammonium hydroxide (TMAH) or hydrofluoric acid (HF) in an oxygen atmosphere.

After these steps, the profile imprinted in the resin is transferred to the underlying layer 120, typically a substrate or a functional thin film of a device being manufactured.

It should be noted here that the method of the invention does not require the removal of the residual layer 131 of resin with all the disadvantages mentioned in the prior art. One criterion of quality for this residual layer is its uniformity in terms of thickness (in the plane X, Y). It has been noted that this uniformity is even easier to be obtained since minimizing it is not sought. This uniformity of thickness of the residual layer 131 and of the reliefs allow faithful reproduction of the imprinted patterns via ion implantation that is thus carried out identically over the entire surface of a wafer, the base element from which microelectronic devices are routinely produced.

The explanations that follow provide additional and optional details on the steps of the method of the invention and proposes specific examples of embodiments.

The substrate or the layer 120 to be etched are typically made of silicon. More generally, all crystalline substrates, including those made of quartz and of sapphire, can benefit from the implementation of the method of the invention. Those made of silicon also have the advantage of being compatible with all the methods developed for microtechnologies and nanotechnologies.

The material forming the layer 110 that is used as a temporary mask can be, as seen above, a resin used in lithography or an inorganic polymer of the type obtained by "sol-gel" methods. As discussed in the prior art, the formation of the 3D patterns in the layer 110 conventionally uses the technology of nanoimprint lithography using a mold that itself contains the patterns to reproduced. If the mold is manufactured from a material not transparent to the wavelengths of the ultraviolet (UV), which is the case for a mold made of silicon, for example, a thermal nanoimprint method and the use of a thermoplastic resin are involved. The thickness of resin deposited will be determined, as discussed in the chapter on the prior art, by the volume of the cavities of the mold that must be filled, while ensuring that the residual thickness after pressing is not zero and at least equal to a minimum implantation depth.

In the case of the use of an implanter for this operation carried out in step 420, and as discussed below, the residual thickness is advantageously at least greater than 30 nm which thus allows the species to be implanted up to the interface between the substrate 120 and the imprintable layer 110, the minimum implantation depth here being at least 30 nm and more generally between 10 and 30 nm.

Moreover, as already mentioned, it is desired to optimize the imprinting method in such a way that the residual thickness be homogenous over the entire imprinted surface rather than seeking to minimize it as is the case for the methods for transfer via dry etching. This phase of optimizing the homogeneity is generally reached when the residual thickness after pressing is more significant.

For the thermal imprint method, the latter can be created, for example, with a resin such as PMMA poly(methyl methacrylate), PS (polystyrene), at pressures from several bar to several tens of bars and at glass transition temperatures of the resin (Tg) between +10° C. and +100° C. The step of removal from the mold, an operation in which the mold is separated from the layer of resin, is carried out at temperatures lower than these transition temperatures (Tg) in such a way that the resin is solid at this time.

For the implantation step 420 an implanter called "beam line implanter" is conventionally used. This piece of equipment comprises a source for producing ions, a particle accelerator using the electrostatic properties of the ion in order to accelerate it, and a chamber for the target. The ions are thus accelerated and directed towards the target where the device to be implanted is located. In this case, the depth implanted can reach several tens of nanometers. However, it is difficult to implant on the surface because there is a non-zero minimum energy provided to the ions that is 1 keV (kilo-electron volt). This minimum energy inevitably causes penetration of the implanted ions into the substrate. The ions are therefore at a distance from the surface of the latter, even if this is at a small depth. There is thus a zone between the surface and this depth that does not have any or has a very small concentration of implanted species. This does not therefore allow a surface modification, of approximately only several nanometers, to be carried out.

The minimum implantation depth that can be obtained in these conditions is approximately 30 nm.

However, in the context of the present invention, it is sought to implant a zone that is buried. Thus, the ions are not implanted starting from the surface of the underlying layer 120. This allows the definition of a zone, non-implanted from extending the surface of the underlying layer 120.

If the minimum implantation depth is greater than the thickness of certain zones of the imprintable layer, then the underlying layer is not modified from its surface under these zones. More specifically, an upper area of the underlying layer, extending from its surface, is not modified.

The addition of a buffer layer 510, one advantage of which will be mentioned below, must be controlled in order for the ions, once implanted, to only be implanted starting from a non-zero depth. Thus, the thickness of the residual layer 131 is chosen in such a way that it is less thick than the minimum depth of the implantation.

The thickness of this layer thus allows the substrate 120 to be implanted while producing a non-implanted continuous layer 127 on the surface of the layer 120 to be etched. In this type of reactor, the implantation is carried out at a given depth, generally labeled Rp. Around this depth Rp, the implantation zone typically extends over several tens of nanometers in the implantation direction. In order to obtain a modification of the substrate that is continuous but buried under a non-implanted layer, it is therefore necessary to ensure overlapping of the modified depths of the substrate after each implantation step.

Figure 5A:
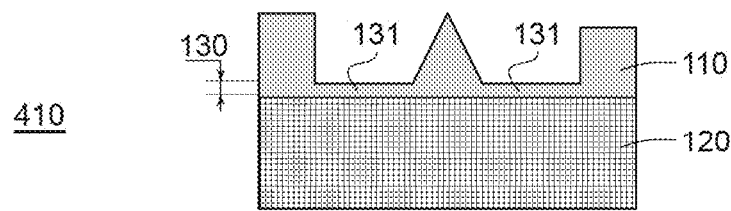
FIG. 5, consisting of FIGS. 5a to 5d, illustrates an alternative to the method of FIG. 4, in which a protective layer on the imprintable layer is used.
Figure 7A:
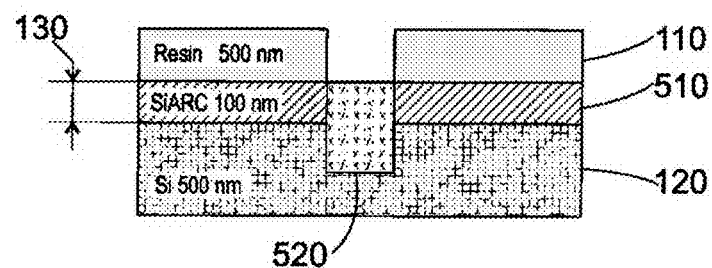
FIG. 7, consisting of FIGS. 7a and 7b, illustrates, in FIG. 7a, a stack comprising a buffer layer and illustrates, in FIG. 7b, the result of the implantation when varying certain implantation parameters.
Figure 7B:
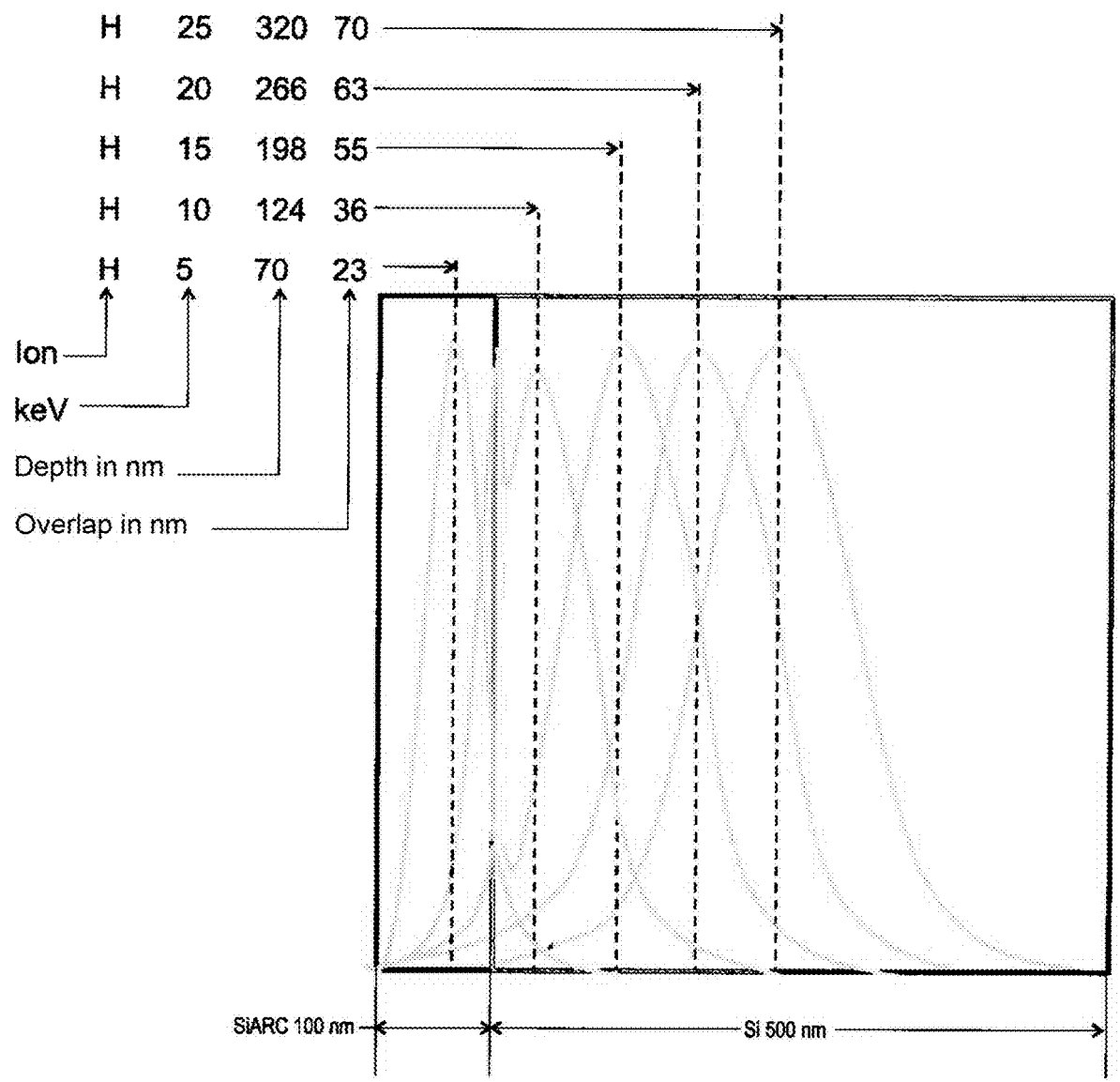

An example of the results of an implantation operation carried out in step 420 is illustrated by FIG. 7*b*. This implantation is applied to the stack of layers illustrated in FIG. 5*a*.

The stack successively comprises a substrate 120, a buffer layer 510 and an imprintable layer 110. In this example, the buffer layer 510 is made from SiARC, an anti-reflective material routinely used in lithography. In this case, it has a thickness of 100 nm for an implantation in the silicon forming the substrate that extends 520 over a depth of 350 nm.

As can be seen in FIG. 7b, in this example, five successive implantations of hydrogen (H) ions with energies between 5 and 25 keV and the same dose of $10^{15}$ atoms/cm$^2$ are carried out. The conditions are calculated in order for there to be overlapping of the implantation profiles. The implantations are obtained at depths and with overlapping as indicated in table 530.

In this example, in order to obtain modified zones 122 located under a non-modified layer 127 extending from the upper face of the layer 120 to be etched, it can be seen that the implantations at 5 and 10 keV must be avoided.

The step of removing the imprintable layer 110 is then carried out for example in an etching chamber using chemistry based on oxygen or via a wet process using chemistry routinely used by a person skilled in the art using a mixture called SPM of sulfuric acid (H2SO4) combined with hydrogen peroxide or oxygenated water (H2O2). This step is perfectly known and mastered by a person skilled in the art.

It should be noted that in order to access the modified zones 122 buried under the non-modified layer 127, it can be useful to make openings 123. The etching solution is introduced via these openings.

The conditions of removal of the modified layer must be such that this method must not consume any or consume only a little of the non-modified material that is to say not more than several nanometers per minute. Typically, the substrate is made of silicon and the silicon made amorphous by the implantation must be removed under the conditions described, selectively with respect to the crystalline silicon. As already mentioned, the use of tetramethylammonium hydroxide (TMAH) or hydrofluoric acid (HF) in an oxygen atmosphere is particularly advantageous. The crystalline silicon is indeed not at all or only slightly consumed by this type of cleaning.

The paragraphs below describe another advantage directly linked to the residual thickness 131 that remains at the bottom of the patterns after nanoimprinting.

Indeed, this residue of resin, usually perceived as a disadvantage of nanoimprinting, is used here as a protective layer that protects the layer 120 to be etched during the implantation. This residual thickness 131 is not etched, or not entirely etched, during the implantation step 421. Vertically in line with the nanoimprinted patterns, the layer 120 to be etched is thus not exposed during the implantation.

This embodiment provides a significant advantage. Indeed, in the absence of a residue having a sufficient thickness, the desired implantation of the layer 120 to be etched inevitably produces a bombardment of the surface of the carbon imprintable layer 110. This masking layer 110 is thus atomized on the surface. This bombardment tends to radiate atoms of carbon initially present in the imprintable layer 110. A portion of these atoms of carbon is projected into the layer 120 to be etched in the locations where it is exposed. In the context of the development of the present invention, it was noted that these atoms of carbon penetrate the layer 120 to be etched and thus form, in this layer, a surface film rich in carbon that can, according to the uses, modify the behavior of this layer. For example, this parasitic implantation of carbon can modify the surface energy properties or the optical properties of the layer 120 to be etched.

The invention, by providing a residual thickness 131 that prevents the layer 120 to be etched from being exposed vertically in line with the nanoimprinted pattern of the imprintable layer 110, is able to protect the face 128 of the layer 120 to be etched from any addition of carbon. The thickness 130 of the residual thickness 131 is chosen in such a way that the atoms of carbon do not pass through it. Typically, this thickness is greater than 20 nm and preferably greater than 30 nm during the implantation.

The residual thickness 131 covering the layer 120 to be etched is removed, for example during the etching of the latter.

Figure 4A:
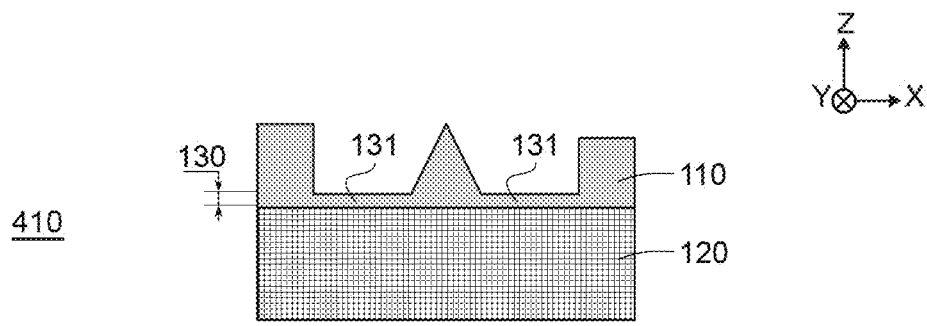
FIG. 4, consisting of FIGS. 4a to 4c, illustrates a method according to an embodiment of the invention in which structures buried in a substrate are created.
Figure 4B:
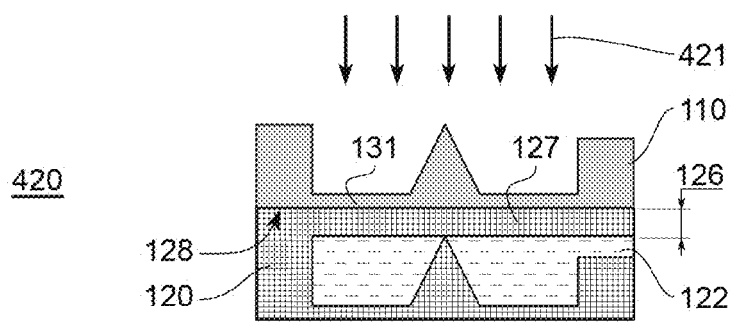
Figure 4C:
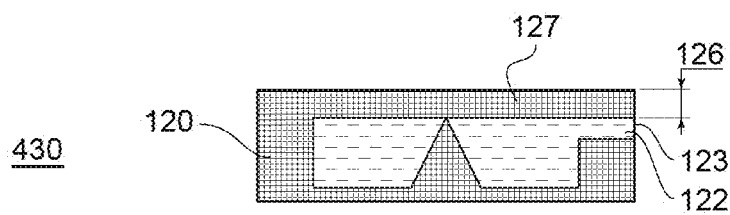

FIG. 4 that consists of FIGS. 4a to 4c, illustrates a particular embodiment of the present invention. This embodiment allows buried 3D structures to be created, the properties of which, for example electric, optical, magnetic, mechanical and thermal, are modified. This alternative comprises the following steps:

As illustrated by FIG. 4a, nanoimprinting of complex shapes in an imprintable material 110 is carried out like in the step 410 previously described. As indicated above, preferably it is not sought to minimize the thickness 130 of the residual layer 131 in order to ensure that the latter is homogenous over the entire surface in question.

Then, as illustrated in FIG. 4b, an implantation of ions 421 is carried out, for example hydrogen ions, through the imprintable layer 110 preformed via nanoimprinting, to various depths, in the underlying layer 120, that is to say, the substrate or the thin film to be patterned. The zones in the underlying layer 120 under the areas in which the thickness of resin is the smallest are modified to a greater depth. The material of the underlying layer 120 is modified via implantation for example by making it amorphous when it is initially crystalline. The zones of the substrates under the zones in which the thickness of resin is the greatest are not modified by the implantation. The implantations are adjusted in this case in order for the zone modified by the implantation closest to the interface with the air that is to say the substrate/resin or layer/resin interface to be buried under a predetermined thickness 126 in such a way that it cannot be removed from the substrate or from the layer by a dry or wet process. Thus, after the implantation, the underlying layer 120 has a non-modified area 127 that is continuous at the surface of the underlying layer 120 and extends from the surface of this same layer 120 in the implantation direction.

More specifically, the layer 120 to be etched has a non-modified zone between each zone 122 modified by implantation and the upper face 128 of this layer 120 to be etched. Thus, no zone 122 modified by implantation extends from the upper face 128 of this layer 120 to be etched. The upper face 128 of this layer 120 to be etched is the face that is turned towards the layer that is imprintable and through which the ions penetrate during the implantation 421.

This zone 127 is therefore continuous along the thickness of the stack, i.e. in the direction z of the reference frame illustrated in FIG. 4a. This non-modified zone 127 preferably extends over the entire surface of the layer 120 to be etched. Alternatively, it only extends over a portion of the upper face 128 of the layer 120 to be etched. According to one embodiment, it extends vertically in line with only some of the modified zones 122.

The thickness 126 of the continuous non-modified zone 127 is not necessarily constant over the entire surface of the layer 120 to be etched. In the example illustrated in FIG. 8b, this thickness is constant.

Preferably, this thickness 126 is greater than or equal to 10 nm and preferably greater than or equal to 20 nm, preferably greater than or equal to 30 nm and preferably greater than or equal to 40 nm.

Thus, the modified zones 122 are all located at a distance from the upper face 128 of the layer 120 to be etched.

This non-modified layer 127 allows the patterns formed by the implantation 421 to be encapsulated.

In this embodiment, the minimum implantation depth is greater than the thickness of the residual layer 131.

As illustrated in FIG. 4c, the material 110 previously nanoimprinted is then removed using dry and/or wet processes, as already described, without affecting the modified zone that is buried.

Thus, modified zones 122 are obtained that are encapsulated in the non-modified material of the underlying layer 120.

According to one embodiment, the modified zones 122 are subsequently removed selectively with respect to the non-modified material. For this, openings 123 are made in order to access these zones, as illustrated in FIG. 4c.

In this case, the patterns formed by the non-modified zones are thus surrounded, at least partially, by a vacuum or gas. The gas can be ambient air. It can also be a gas injected into the cavity formed by the removal of the modified zones. Indeed, gas can be injected via the input that was used for the etching of the modified zones. At least one of the optical, electric, magnetic, thermal or mechanical properties of the patterns formed by the non-modified zones is thus different than that of the gas that surrounds these patterns.

If one or more gases are injected into the cavity or cavities, after the injection, the openings 123 that were used for the etching of the modified zones and the injection of the gas must be closed. For example, a resin that plugs the openings 123 can be spin coated on. This resin is preferably exposed to a source of light in order to stabilize it at the location of the opening 123, and the rest of the non-exposed resin is removed by a treatment well known to a person skilled in the art. A plug is thus formed at the location of the openings 123.

According to another embodiment, the modified zones 122 are preserved. They are not removed selectively with respect to the non-modified material. In this case, at least one of their optical, electric, magnetic, thermal or mechanical properties is different from that of the patterns formed by a non-modified zone.

This solution for encapsulating and protecting patterns is particularly advantageous. Indeed, it is precise, allows very good size control of the patterns. Moreover, it is faster, less complex and less costly that a solution in which an encapsulation layer is deposited on the previously implanted zones or on the previously implanted and etched zones.

Figure 5B:
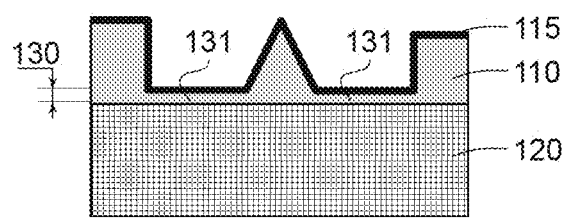
Figure 5C:
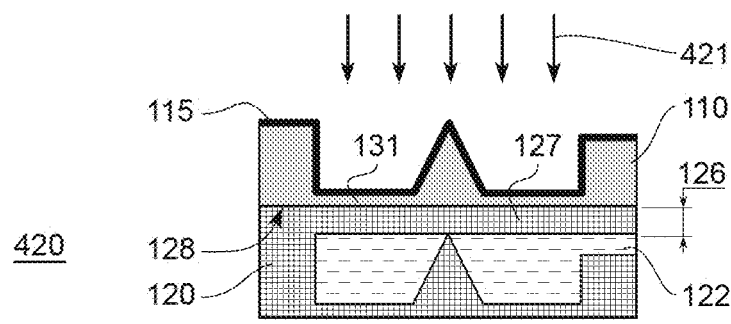
Figure 5D:
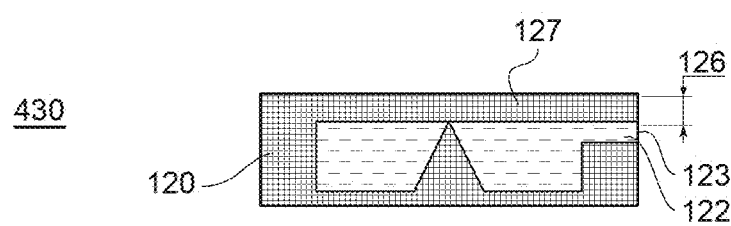
Figure 6A:
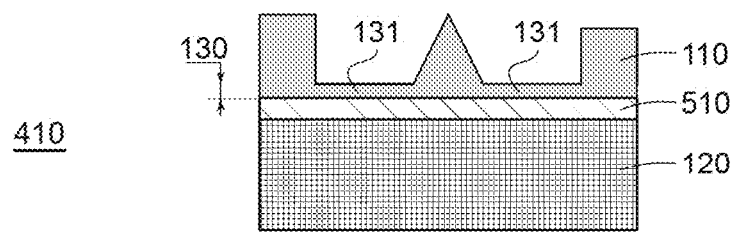
FIG. 6, consisting of FIGS. 6a to 6d, briefly describes the main steps of a method according to an embodiment of the invention particularly well suited for the etching of SiOCH.
Figure 6B:
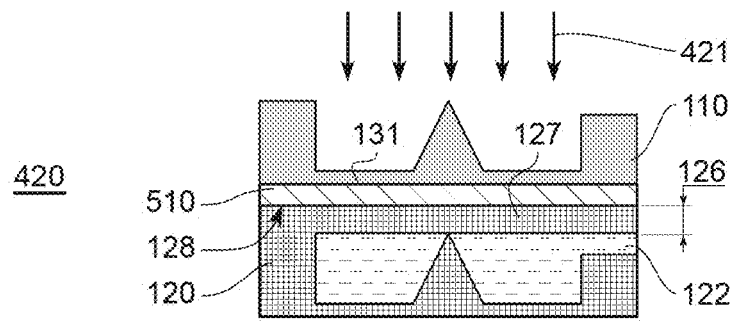
Figure 6C:
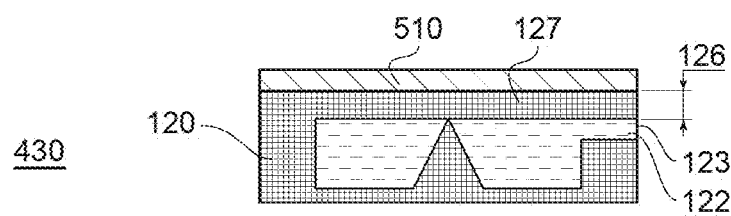
Figure 6D:
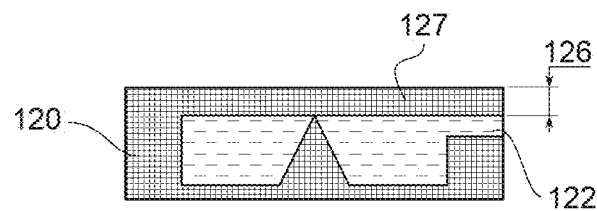

FIG. 5 consisting of FIGS. 5a to 5e describes an alternative for the implementation of the method in which, after the step, during which the 3D patterns are formed in the imprintable layer 110, and before the implantation step 421, an additional step is inserted during which, as shown in FIG. 5b, a protective layer 115 covering the prior patterns formed in the imprintable layer 110 and protecting these patterns during the implantation 421 is deposited. This protective layer 115 is advantageously a carbon layer 115. The thickness deposited is several nanometers. Typically, 1 to 5 nanometers of carbon are deposited. This operation can be carried out in a deposition or etching chamber in which a plasma is created for example from methane (CH4). The carbon layer 115 may be necessary for protecting the surface of the material imprinted via nanoimprinting, advantageously resin, and thus limiting the consumption of the latter during the implantation step 421 that follows. If an etching chamber is used for this operation, a capacitively (CCP) or inductively (ICP) coupled reactor, for example, can be used. This type of deposition well known to a person skilled in the art can be obtained in general by using gases such as hydrocarbon (CxHy) or carbon fluoride (CxFy).

The removal of the layer of carbon 115 can be carried out, for example, via a plasma based on Oxygen.

As indicated above, the invention is particularly advantageous in the case in which the underlying layer 120 is made of silicon or from one of the following materials: glass, silicon germanium, germanium, silicon nitride, sapphire, quartz.

According to yet another embodiment, the layer to be etched is made of carbon-doped hydrogenated silicon oxide (SiOCH). This can be porous or dense SiOCH. This material has the advantage of having a very low permittivity, in particular when it is porous.

All the embodiments described above can be applied to SiOCH. The main steps of a particularly advantageous embodiment will be described below in reference to FIGS. 6a to 6d.

1. 410—Stack and lithography (FIG. 6a): A layer of resin forming the imprintable layer 110 is deposited on an underlying layer 120 of SiOCH that can itself rest on a substrate 121, for example made of silicon. Between the imprintable layer 110 and the layer 120 of SiOCH, a buffer layer 510 is formed, for example an oxide (SiO2) or more generally SixOy or a nitride (SiN) or more generally SixNy. This buffer layer 510 is used to facilitate the lithography as will be explained below. It also acts as a buffer layer for protecting the SiOCH during the implantation, since this material has a low density it is easily atomized.

Using this stack, a step of nanoimprint lithography (NIL) is carried out. After pressing of the mold, a residue of resin 131 having a thickness 130 remains at the bottom of the patterns. Moreover, as has been described above, the residual thickness 131 forms a layer allowing the atoms of carbon that are torn from the surface of the layer of resin 110 and that have a tendency to penetrate the underlying layer 120 of SiOCH to be stopped.

2. 420—Implantation (FIG. 6b): The implantation 421 is carried out through the imprintable layer 110 and thus, vertically in line with the patterns, through the residual thickness 131 and the buffer layer 510. The implantation 421 can be carried out in ion beam or plasma immersion ion implantation equipment. The energy and the implantation dose are defined according to the profile and the maximum depth desired for the implantation and the minimum depth of the non-modified continuous zone 127. The thickness of this zone 127 is labelled 126. Simulations on a Crystal TRansport of Ions in Mater (C-trim) applet allow the depth of implantation in the materials to be predicted.

The ion implantation leads to modifications in the material, in particular the breaking of certain bonds. Under the effect of the implantation, the SiOCH loses its methyl groups and tends to a structure close or similar to that of an SiO2. This allows high selectivity during the wet etching to be created.

In the context of the present invention, it has been noted that regardless of the species of the ion implanted, an atomization of the SiOCH takes place. The integration of the buffer layer 510 cited above thus becomes particularly advantageous.

In the context of the development of the present invention, Hydrogen turned out to be particularly advantageous. Indeed, hydrogen allows very high selectivity to be obtained when other species such as Argon show "infinite" resistance to wet etching with HF.

3. 430—Removal of the masking layer (FIG. 6c): The removal of the imprintable layer 110 made of resin can be carried out via a wet or dry process. During this step, the buffer layer 510 advantageously protects the upper face 128 of the SiOCH. This face 128 is not therefore altered by addition of carbon coming from the imprintable layer 110.

4. Etching of the modified SiOCH (FIG. 6d) (optional step): This removal step is optional. Indeed, it may be desired to preserve the modified SiOCH. If it is desired to remove it, the etching is preferably carried out with a solution of HF diluted to 1%. As explained above, the implantation generates modifications in the SiOCH that manifest themselves as the hydrophilization of the material, the rupture of the methyl groups and finally the formation of the Si—O bonds. This provides infinite selectivity with respect to the non-modified zone up to an etching time of less than 240 seconds.

This step also allows the buffer layer 510, for example made of SiN or SiO2, to be removed.

The technique described above for texturing SiOCH has several advantages:

The mask formed by the imprintable layer 110 is not metallic but organic which confers numerous advantages in terms of method.

The nanoimprint lithography used to create the pattern is not very costly and is accurate. Moreover, the resin residue at the bottom of the pattern can act as a protective layer for protecting the layer of SiOCH against the undesired addition of carbon during the implantation as has been described above. Moreover, it protects the SiOCH during the removal of the resin.

The etching is carried out via a wet process which allows size control and a better surface state than with dry etching to be preserved.

According to an alternative embodiment, the removal of the masking layer 110 made of resin can be carried out during the step of wet etching with an HF solution, in particular if a resin containing Silicon such as Hydrogen silsesquioxane (HSQ) is used.

The invention is not limited to the embodiments described above and extends to all the embodiments covered by the claims.

The invention claimed is:

1. A method for producing subsequent patterns in an underlying layer, the method comprising at least one step of producing prior patterns in a imprintable layer on top of the underlying layer, wherein the production of the prior patterns comprises nanoimprinting of the imprintable layer and leaves in place, at the bottom of the patterns, residual thicknesses of imprintable layer, the imprintable layer thus forming a continuous layer covering the underlying layer, comprising the following step:

modifying the underlying layer via ion implantation in the underlying layer, the implantation being carried out through the imprintable layer comprising the prior patterns and said residual thicknesses), the parameters of the implantation comprise in particular an implantation direction and wherein the implantation direction is perpendicular to a main plan in which the underlying layer extends, the parameters of the implantation being chosen in such a way as to form, in the underlying layer, zones modified by the implantation and non-implanted zones, the non-implanted zones defining the subsequent patterns and having a geometry that is dependent on the prior patterns;

wherein the step of producing prior patterns is carried out in such a way that for each of the patterns, the residual thickness of the imprintable layer is less than the minimum implantation depth of the ions implanted during said implantation, the minimum depth being taken in the implantation direction and starting from the surface of the imprintable layer wherein the implantation of ions is carried out in such a way that the underlying layer has a continuous non-modified zone located between the modified zones and a face of the underlying layer through which the ions penetrate during the implantation, wherein the underlying layer is a single homogeneous layer, and wherein the non-modified zone extends on all the surface of the underlying layer, so that the subsequent patterns are protected by the non-modified zone, the non-modified zone and the subsequent patterns being made of the same material.

2. The method according to claim 1, wherein the materials of the imprintable layer and of the underlying layer, as well as the parameters of the implantation, in particular the nature of the ions, are chosen in such ways that the materials of the imprintable layer and of the underlying layer have identical capacities of penetration of the ions.

3. The method according to claim 2, wherein the parameters of the implantation are chosen in such a way that the subsequent patterns have a geometry identical to that of the prior patterns.

4. The method according to claim 1, wherein the continuous non-modified zone located between the modified zones and a face of the underlying layer through which the ions penetrate during the implantation has a thickness greater than or equal to 10 nm.

5. The method according to claim 1, wherein, after the modification step, at least a portion of the modified zones and of the non-modified zone are preserved.

6. The method according to claim 5, wherein the modified zones have properties different from that of the non-modified zones, the properties being chosen out of electric, magnetic, thermal properties.

7. The method according to claim 6, wherein the modified zones have optical properties different from that of the non-modified zones.

8. The method according to claim 5, wherein, the implantation is carried out using an implanter configured in such a way as to only implant ions starting from a non-zero depth of the underlying layer.

9. The method according to claim 1, comprising, between the step of producing the prior patterns and the implantation step, a step of depositing a protective layer covering the prior patterns.

10. The method according to claim 9, wherein the protective layer is a layer of carbon deposited via a plasma.

11. The method according to claim 1, wherein the ions are taken from the following ions: hydrogen (H2), helium (He), argon (Ar) and nitrogen (N2).

12. The method according to claim 1, wherein the underlying layer (120) is a layer or a substrate, the material of which is taken from: silicon, silicon germanium, germanium, quartz.

13. The method according to claim 1, wherein the underlying layer is a layer or a substrate, the material of which is SiOCH.

14. The method according to claim 13, comprising a step of removing the imprintable layer and wherein during the removal step, there is a buffer layer on top of the underlying layer made of SiOCH, located between the imprintable layer and the underlying layer.

15. The method according to claim 14, wherein the buffer layer is made of SixNy or SixOy, preferably of SiN or SiO2.

16. The method according to claim 14, wherein during the implantation, the buffer layer has a thickness greater than or equal to 10 nm.

17. A method for producing subsequent patterns in an underlying layer, the method comprising at least one step of producing prior patterns in a imprintable layer on top of the underlying layer, wherein the production of the prior patterns comprises nanoimprinting of the imprintable layer and leaves in place, at the bottom of the patterns, residual thicknesses of imprintable layer, the imprintable layer thus forming a continuous layer covering the underlying layer, comprising the following step:
- modifying the underlying layer via ion implantation in the underlying layer, the implantation being carried out through the imprintable layer comprising the prior patterns and said residual thicknesses), the parameters of the implantation comprise in particular an implantation direction and wherein the implantation direction is perpendicular to a main plan in which the underlying layer extends, the parameters of the implantation being chosen in such a way as to form, in the underlying layer, zones modified by the implantation and non-implanted zones, the non-implanted zones defining the subsequent patterns and having a geometry that is dependent on the prior patterns;
- wherein the step of producing prior patterns is carried out in such a way that for each of the patterns, the residual thickness of the imprintable layer is less than the minimum implantation depth of the ions implanted during said implantation, the minimum depth being taken in the implantation direction and starting from the surface of the imprintable layer
- wherein the implantation of ions is carried out in such a way that the underlying layer has a continuous non-modified zone located between the modified zones and a face of the underlying layer through which the ions penetrate during the implantation; and
- after the modification step, at least one step of removing the modified zones carried out selectively with respect to the non-modified zones, in such a way as to leave in place the non-modified zones.

18. The method according to claim 17, wherein the removal step comprises a step of etching the modified zones selectively with respect to the non-modified zones, the etching step being etching via a wet process or a dry process.

19. The method according to claim 18, wherein said etching of the modified zones forms at least one cavity, wherein as least one gas in introduced into said cavity, and wherein a plug is then formed in order to plug an opening though which said at least one gas was introduced into the cavity.

20. The method for producing subsequent patterns in an underlying layer, the method comprising at least one step of producing prior patterns in a imprintable layer on top of the underlying layer, wherein the production of the prior patterns comprises nanoimprinting of the imprintable layer and leaves in place, at the bottom of the patterns, residual thicknesses of imprintable layer, the imprintable layer thus forming a continuous layer covering the underlying layer, comprising the following step:
- modifying the underlying layer via ion implantation in the underlying layer, the implantation being carried out through the imprintable layer comprising the prior patterns and said residual thicknesses), the parameters of the implantation comprise in particular an implantation direction and wherein the implantation direction is perpendicular to a main plan in which the underlying layer extends, the parameters of the implantation being chosen in such a way as to form, in the underlying layer, zones modified by the implantation and non-implanted zones, the non-implanted zones defining the subsequent patterns and having a geometry that is dependent on the prior patterns;
- wherein the step of producing prior patterns is carried out in such a way, that for each of the patterns, the residual thickness of the imprintable layer is less than the minimum implantation depth of the ions implanted during said implantation, the minimum depth being taken in the implantation direction and starting from the surface of the imprintable layer
- wherein the implantation of ions is carried out in such a way that the underlying layer has a continuous non-modified zone located between the modified zones and a face of the underlying layer through which the ions penetrate during the implantation, and
- wherein the underlying layer forms the active layer of a photovoltaic cell.

21. The method for producing subsequent patterns in an underlying layer, the method comprising at least one step of producing prior patterns in a imprintable layer on top of the underlying layer, wherein the production of the prior patterns comprises nanoimprinting of the imprintable layer and leaves in place, at the bottom of the patterns, residual thicknesses of imprintable layer, the imprintable layer thus forming a continuous layer covering the underlying layer, comprising the following step:
- modifying the underlying layer via ion implantation in the underlying layer, the implantation being carried out through the imprintable layer comprising the prior patterns and said residual thicknesses), the parameters of the implantation comprise in particular an implantation direction and wherein the implantation direction is perpendicular to a main plan in which the underlying layer extends, the parameters of the implantation being chosen in such a way as to form, in the underlying layer, zones modified by the implantation and non-implanted zones, the non-implanted zones defining the subsequent patterns and having a geometry that is dependent on the prior patterns;
- wherein the step of producing prior patterns is carried out in such a way that for each of the patterns, the residual thickness of the imprintable layer is less than the minimum implantation depth of the ions implanted during said implantation, the minimum depth being taken in the implantation direction and starting from the surface of the imprintable layer
- wherein the implantation of ions is carried out in such a way that the underlying layer has a continuous non-modified zone located between the modified zones and a face of the underlying layer through which the ions penetrate during the implantation, and
- wherein the underlying layer is a substrate made of sapphire and forms, together with the subsequent patterns, a patterned sapphire substrate (PSS).

22. A method for manufacturing a light-emitting diode (LED) comprising a patterned sapphire substrate (PSS), wherein the patterned sapphire substrate (PSS) is obtained by the method for producing subsequent patterns in an underlying layer, the method comprising at least one step of producing prior patterns in a imprintable layer on top of the underlying layer, wherein the production of the prior patterns comprises nanoimprinting of the imprintable layer and leaves in place, at the bottom of the patterns, residual thicknesses of imprintable layer, the imprintable layer thus forming a continuous layer covering the underlying layer, comprising the following step:

modifying the underlying layer via ion implantation in the underlying layer, the implantation being carried out through the imprintable layer comprising the prior patterns and said residual thicknesses), the parameters of the implantation comprise in particular an implantation direction and wherein the implantation direction is perpendicular to a main plan in which the underlying layer extends, the parameters of the implantation being chosen in such a way as to form, in the underlying layer, zones modified by the implantation and non-implanted zones, the non-implanted zones defining the subsequent patterns and having a geometry that is dependent on the prior patterns;

wherein the step of producing prior patterns is carried out in such a way that for each of the patterns, the residual thickness of the imprintable layer is less than the minimum implantation depth of the ions implanted during said implantation, the minimum depth being taken in the implantation direction and starting from the surface of the imprintable layer wherein the implantation of ions is carried out in such a way that the underlying layer has a continuous non-modified zone located between the modified zones and a face of the underlying layer through which the ions penetrate during the implantation, and wherein the underlying layer is a substrate made of sapphire and forms, together with the subsequent patterns, a patterned sapphire substrate (PSS).

* * * * *